(12) United States Patent
Hsu et al.

(10) Patent No.: US 9,755,056 B2
(45) Date of Patent: Sep. 5, 2017

(54) METHOD FOR FORMING SEMICONDUCTOR DEVICE

(71) Applicant: UNITED MICROELECTRONICS CORP., Hsin-Chu (TW)

(72) Inventors: Chih-Kai Hsu, Tainan (TW); Chao-Hung Lin, Changhua County (TW); Yu-Hsiang Hung, Tainan (TW); Ssu-I Fu, Kaohsiung (TW); Ying-Tsung Chen, Kaohsiung (TW); Shih-Hung Tsai, Tainan (TW); Jyh-Shyang Jenq, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 11 days.

(21) Appl. No.: 14/607,085

(22) Filed: Jan. 28, 2015

(65) Prior Publication Data

US 2016/0190287 A1    Jun. 30, 2016

(30) Foreign Application Priority Data

Dec. 31, 2014 (CN) .......................... 2014 1 0848409

(51) Int. Cl.
*H01L 21/336* (2006.01)
*H01L 29/66* (2006.01)
(Continued)

(52) U.S. Cl.
CPC .. *H01L 29/66795* (2013.01); *H01L 21/31144* (2013.01); *H01L 21/76816* (2013.01);
(Continued)

(58) Field of Classification Search
CPC ............. H01L 21/76838; H01L 23/485; H01L 29/66795; H01L 21/31144; H01L 29/665; H01L 21/76816; H01L 21/76897
(Continued)

(56) References Cited

U.S. PATENT DOCUMENTS

| 2005/0095763 A1* | 5/2005 | Samavedam ..... H01L 21/28079 438/197 |
| 2007/0066047 A1* | 3/2007 | Ye ..................... H01L 21/31144 438/620 |

(Continued)

OTHER PUBLICATIONS

Hung, Title of Invention: Method of Forming Semiconductor Structure Having Contact Plug, U.S. Appl. No. 13/740,289, filed Jan. 14, 2013.

(Continued)

*Primary Examiner* — Allen Parker
*Assistant Examiner* — Patricia Reddington
(74) *Attorney, Agent, or Firm* — Winston Hsu

(57) ABSTRACT

A method of forming a semiconductor device includes following steps. Firstly, a substrate having a transistor is provided, where the transistor includes a source/drain region. A dielectric layer is formed on the substrate, and a contact plug is formed in the dielectric layer to electrically connect the source/drain region. Next, a mask layer is formed on the dielectric layer, where the mask layer includes a first layer and a second layer stacked thereon. After this a slot-cut pattern is formed on the second layer of the mask layer, and a contact slot pattern is formed on the first layer of the mask layer. Finally, the second layer is removed and a contact opening is formed by using the contact slot pattern on the first layer.

16 Claims, 8 Drawing Sheets

(51) Int. Cl.
*H01L 21/311* (2006.01)
*H01L 21/768* (2006.01)
*H01L 23/485* (2006.01)

(52) U.S. Cl.
CPC ...... *H01L 21/76897* (2013.01); *H01L 23/485* (2013.01); *H01L 29/665* (2013.01)

(58) Field of Classification Search
USPC ........................................................ 438/299
See application file for complete search history.

(56) References Cited

U.S. PATENT DOCUMENTS

| | | | | |
|---|---|---|---|---|
| 2012/0104471 | A1* | 5/2012 | Chang | H01L 21/76838 257/288 |
| 2015/0318204 | A1* | 11/2015 | Lee | H01L 21/76831 257/288 |

OTHER PUBLICATIONS

Hung, Title of Invention: Semiconductor Device and Method for Fabricating the Same, U.S. Appl. No. 14/536,696, filed Nov. 10, 2014.

* cited by examiner

METHOD FOR FORMING SEMICONDUCTOR DEVICE

BACKGROUND OF THE INVENTION

1. Field of the Invention

The present invention relates to a method of forming a semiconductor device, and more particularly to a method of forming a semiconductor device, which utilizes a multilayer mask layer to form an opening in a dielectric layer.

2. Description of the Prior Art

In recent years, the critical dimension (CD) in semiconductor processes becomes finer with the increasing miniaturization of semiconductor devices. However, as the CD of the semiconductor device is continuously shrunk, the integrated process of forming a semiconductor device having metal gate also faces more challenges and limitations.

As the semiconductor industry has progressed into nanometer technology process nodes in pursuit of highly integrated and high-speed operation, current techniques utilize miniaturized through holes and inter-layer dielectric layers to form a multilayered interconnected wiring structure to electrically connect a metal gate and source/drain regions of a transistor, thereby providing signal input/output pathways for the transistor. However, the current photoresist and lithography techniques are no longer qualified enough to support the currently integrated process while forming metal gate and contact plug. For example, the position shift of the contact plug electrically connected to the source/drain regions easily occurs, and which may directly penetrate the metal gate, thereby affecting the electrical performance of the entire device. For these reasons, how to efficiently improve the current structure of the semiconductor device, as well as the method of forming the same, has become an important task in this field.

SUMMARY OF THE INVENTION

It is one of the primary objectives of the present invention to provide a method of forming a semiconductor device having a contact plug, so as to improve the electrical performance of the entire semiconductor structure.

To achieve the purpose described above, the present invention provides a method of forming a semiconductor device including following steps. First of all, a substrate having a transistor is provided, wherein the transistor includes a gate structure and a source/drain. Next, a first dielectric layer is formed, covering the substrate. Subsequently, a first contact plug is formed in the first dielectric layer, wherein the first contact plug is electrically connected to the source/drain. Then, a second dielectric layer is formed on the first dielectric layer, and a mask layer is formed on the second dielectric layer, wherein the mask layer includes a multilayer structure having a first layer and a second layer stacked on the first layer. After these, a slot-cut pattern is formed on the second layer, and a contact slot pattern is formed on the first layer. The second layer is removed in the following. Finally, a first contact slot is formed in the second dielectric layer through the contact slot pattern on the first layer.

The method of forming the semiconductor device in the present invention is characterized by utilizing a multilayer mask layer, with a first layer and a second layer of the mask layer having at least one slot-cut pattern and a plurality of contact slot patterns respectively, thereby separating the extending stripe of the contact slot into two parts in the following etching process of the contact slot.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention, preferred embodiments will be described in detail. The preferred embodiments of the present invention are illustrated in the accompanying drawings with numbered elements.

Figure 1:
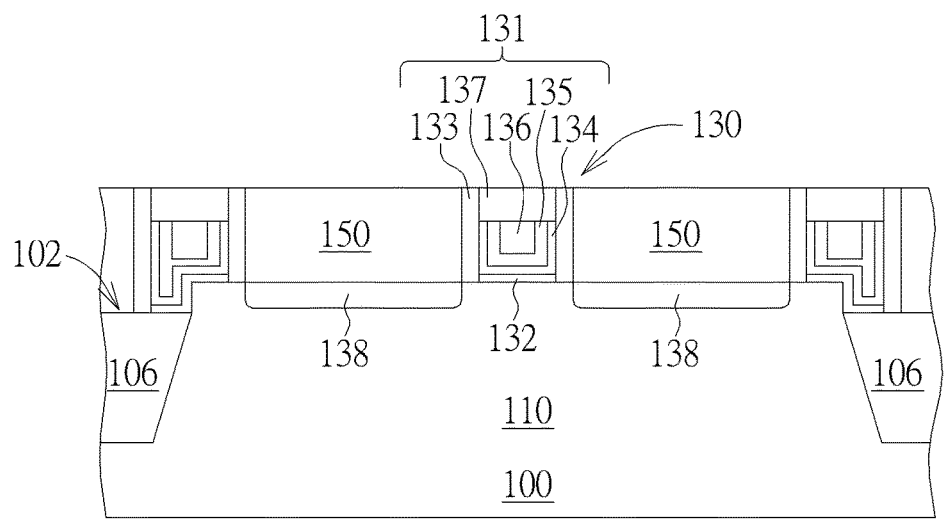
FIG. 1 to FIG. 15 are schematic diagrams illustrating a method of forming a semiconductor device according to one embodiment of the present invention.

Please refer to FIG. 1 to FIG. 15, which schematically illustrate a method of forming a semiconductor device in accordance with one embodiment of the present invention. Firstly, as shown in FIG. 1, a substrate 100 is provided, which may include a semiconductor substrate, for example, a silicon substrate, an epitaxial silicon substrate, a silicon germanium substrate, a silicon carbide substrate or a silicon-on-insulator (SOI) substrate, or a non-semiconductor substrate, for example, a glass substrate, but is not limited thereto. In the present embodiment, at least a fin-shaped structure 110 may be formed on the substrate 100. The method of forming the fin-shaped structure 110 for example including forming a patterned mask (not shown in the drawings) on the substrate 100, transferring a pattern of the patterned mask to the substrate 100 through an etching process, and removing the patterned mask, to form a plurality of trenches 102 in the substrate 100. Subsequently, an insulation layer 106 is filled in the trenches 102, so that a portion of the substrate 100 protruded from the insulation layer 106 forms the fin-shaped structure 110 and the insulation layer 106 forms shallow trench isolations (STI). However, the present invention is not limited thereto, and in another embodiment of the present invention, the fin-shaped structure 110 may also be omitted, and the shallow trench isolations may also be formed directly on a planar substrate, to identify at least one active area.

Next, at least one transistor 130 and an interlayer dielectric layer 150 are formed on the substrate 100. The transistor 130 includes a metal gate structure 131 crossing the fin-shaped structure 110, and a source/drain 138 disposed at two sides of the metal gate structure 131 in the fin-shaped structure 110. In the present embodiment, the method of forming the metal gate structure 131 may include firstly forming an interfacial layer (not shown in the drawings), a high-k gate dielectric layer 132, a dummy gate structure (not shown in the drawings) and a spacer 133 on the substrate 100. Next, the source/drain 138 is formed at two sides of the gate structure 131 in the fin-shaped structure. Subsequently, an interlayer dielectric material layer (not shown in the drawings) is entirely formed on the substrate 100, and then, a planarization process, such as a chemical mechanical polishing/planarization (CMP) process, an etching process or a combination of both, is performed to remove a portion of the interlayer dielectric material layer to expose the dummy gate structure, and to partially remove the dummy gate structure to form a trench (not shown in the drawings). Then, a work function metal material (not shown in the drawings), such as a P type work function metal layer which may include a nitride of nickel (Ni), tungsten (W), molybdenum (Mo), tantalum (Ta) or titanium (Ti), or an N type work function metal layer which may include titanium aluminide (TiAl), aluminum zirconium (ZrAl), aluminum tungsten (WAl), aluminum tantalum (TaAl) or aluminum hafnium (HfAl); a barrier material layer (not shown in the drawings), such as Ti/titanium nitride (TiN) or Ta/tantalum nitride (TaN); and a metal material layer (not shown in the drawings), such as tungsten or aluminum (Al) are sequentially filled in the trench. After these, a CMP process is carried out to remove a portion of the work function metal material layer, the barrier material layer and the metal material layer outside the trench, and an etching back process is then carried out, to partially remove the work function metal material layer, the barrier material layer and the metal material layer to not fill the trench, thereby forming a work function metal layer 134, a barrier layer 135, a metal layer 136 and the interlayer dielectric layer 150 as shown in FIG. 1. In the following, a capping layer 137, such as a silicon nitride layer (SiN), may be formed to fill the trench. Thus, the interlayer dielectric layer 150 may include a top surface level with a top surface of the metal gate structure 131.

It is worth noting that, although the aforementioned embodiment is exemplified as a "gate-last" process and a "high-k first" process, and in another embodiment, the forming method of the present invention may also be carried out in accordance with a "gate-first" process, a "high-k last" process or other metal gate forming process. Additionally, in another embodiment of the present invention, a contact etch stop layer (CESL), for example a monolayer or composite layer, may also be optionally formed on the substrate 100 entirely before the interlayer dielectric material layer is formed, to cover the metal gate structure 131, thereby providing required compressive stress or stretching stress to the metal gate structure 131, but not limited thereto. In the other embodiment of the present invention, under the practical requirements of devices, the method may further include forming an epitaxial layer (not shown in the drawings) at two sides of the metal gate structure 131 before the interlayer dielectric layer 150 is formed, for providing preferable stress effect to the channel under the metal gate structure 131 and increasing the contact area with the contact plug formed in follow-up process.

Figure 2:
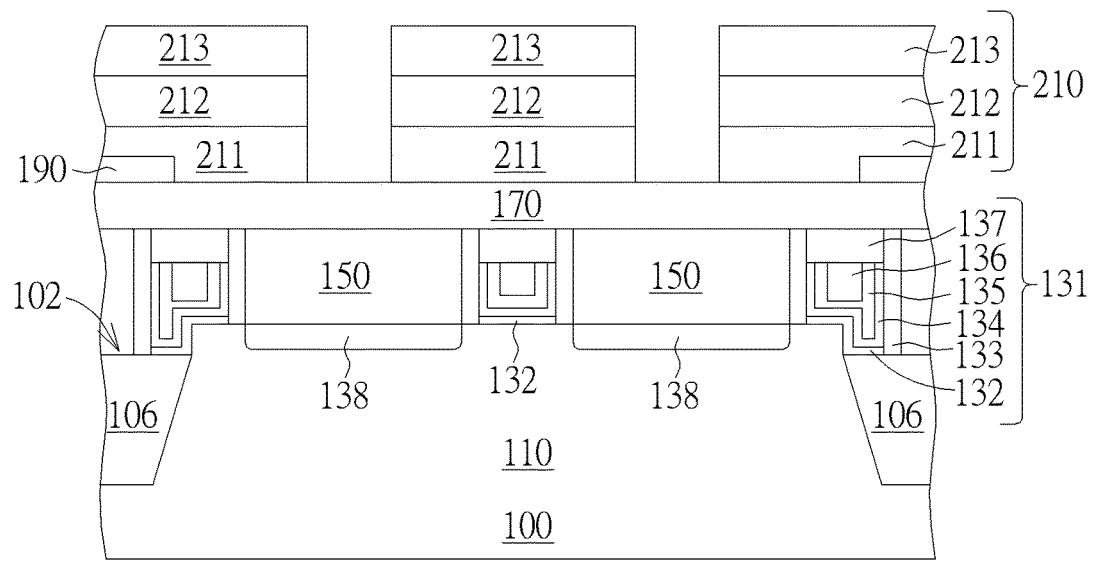
Figure 3:
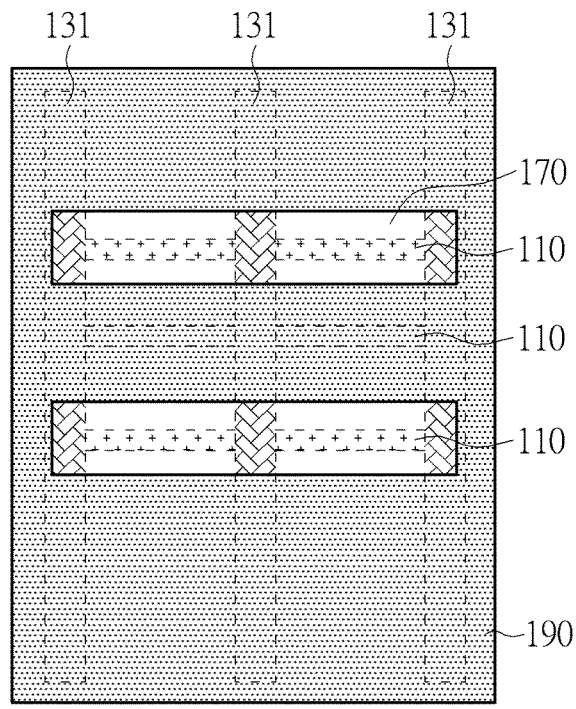
Figure 4:
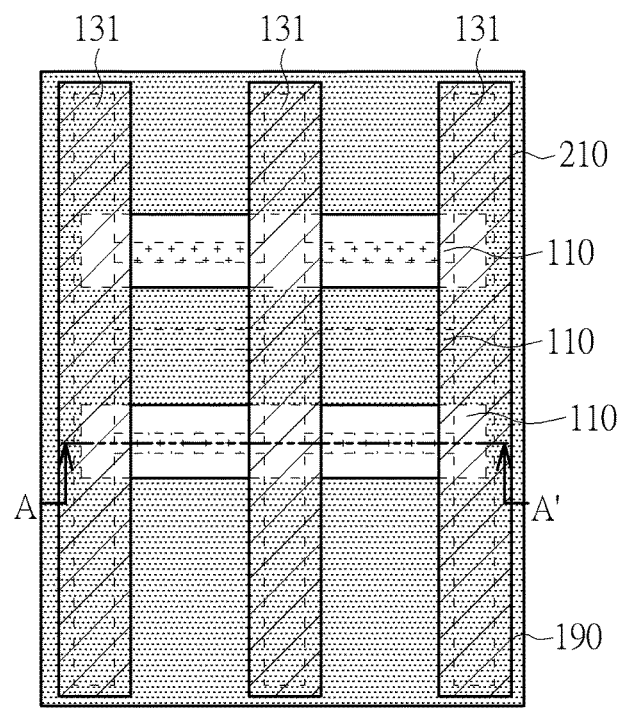

As shown in FIGS. 2-5, a (source/drain) contact slot forming process is carried out, wherein, FIGS. 3-4 are schematic top views illustrating partial steps of the method of forming the semiconductor device, and FIG. 2 is a cross-sectional view taken along the cross line A-A' in FIG. 4. Firstly, please refers to FIG. 2, a dielectric layer 170 is formed on the transistor 130 and the interlayer dielectric layer 150, and a first patterned mask layer 190 and a second patterned mask layer 210 are formed sequentially on the dielectric layer 170. Wherein, the first patterned mask layer 190 covers the dielectric layer 170, and only exposes a portion of the dielectric layer 170 on the fin-shaped structure 110, as shown in FIG. 3, and the second patterned mask layer 210 only covers a portion of the dielectric layer 170 disposed on the transistor 130, as shown in FIG. 4. It is noted that, in the present embodiment, the second patterned mask layer 210 is configured to define the forming position of a contact slot, and the first patterned mask layer 190 is configured to define a blocking pattern of the contact slot, such that, the first patterned mask layer 190 and the second patterned mask layer 210 are directly in contact to partially overlap with each other. In other words, a pattern of the first patterned mask layer 190 crosses a pattern of the second mask layer 210 in a project direction perpendicular to the substrate 100, as shown in FIG. 4.

Furthermore, materials of the above-mentioned dielectric layer 170, the first patterned mask layer 190 and the second patterned mask layer 210 may include different options based on various forming processes. For example, the dielectric layer 170 may include monolayer or multilayer dielectric materials, and preferably being the same as that of the interlayer dielectric layer 150, such as silicon oxide (SiO), silicon oxynitride (SiNO), silicon carbonitride (SiCN). The first patterned mask layer 190 and the second patterned mask layer 210 may include monolayer or multilayer mask materials, and preferably have an etching selectivity relative to the interlayer dielectric layer 150 and the dielectric layer 170. Precisely speaking, as shown in FIG. 2, the first patterned mask layer 190 includes monolayer titanium nitride layer, the second patterned mask layer 210 includes a tri-layer structure having an organic dielectric layer (ODL) 211, such as being made of 365 nm I-line photoresist material or novolac resin; a silicon containing hard mask (SHB) layer 212, such as being made of organosilicon polymers or polysilane; and a photoresist layer 213, such as being made of 248 nm or 193 nm phtoresist material (e.g. KrF photoresist layer), but not limited thereto.

The method of forming the first patterned mask layer 190 and the second patterned mask layer 210 for example includes sequentially forming a first mask material layer (not shown in the drawings) and a first patterned photoresist layer (not shown in the drawings), and transferring a pattern of the first patterned photoresist layer to the first mask material layer, to form the first patterned mask layer 190. Subsequently, after the first patterned photoresist layer is removed, a second mask material layer (not shown in the drawings) and a second patterned photoresist layer (not shown in the drawings) are formed on the dielectric layer 170 and the first patterned mask layer 190, and a pattern of the second patterned photoresist layer is then transferred to the second mask material layer, to form the second patterned mask layer 210. However, people in the arts may easily realize that, in other embodiments of the present invention, the first patterned mask layer 190 and the second patterned mask layer 210 may also be formed through other forming processes. For example, in another embodiment of the present invention, a bottom anti-reflective coating (BARC; not shown in the drawings) layer may be optionally formed under the first patterned mask layer 170.

Figure 5:
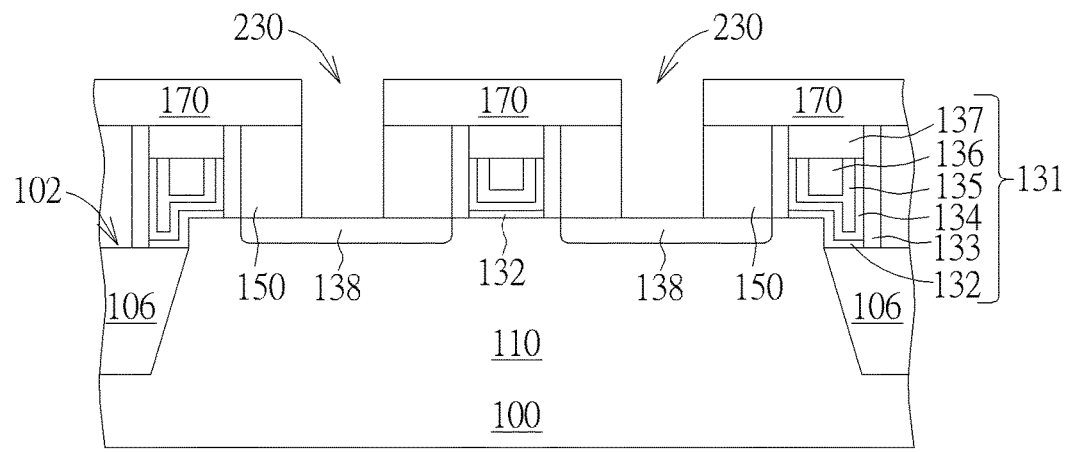

In the following, another etching process, such as a dry etching process, may be carried out directly, by simultaneously using the first patterned mask layer 190 and the second patterned mask layer 210 as an etch mask, to form at least one contact slot 230 penetrated through the dielectric layer 170, the interlayer dielectric layer 150 to reach the source/drain 138. In the present embodiment, since the pattern of the first patterned mask layer partially overlaps the pattern of the second patterned mask layer, the pattern which is both exposed by the first patterned mask layer 190 and the second patterned mask layer 210 may be simultaneously transferred to the dielectric layer 170 and the interlayer dielectric layer 150 underneath, to form a contact slot 230 as shown in FIG. 5. Subsequently, the first patterned mask layer 190 and the second patterned mask layer 210 are removed. It shall be further noted that, the contact slot 230 of the present embodiment may be formed as an extending stripe which is parallel to an extending direction of the metal gate structure, to extend over the source/drain 138, as shown in FIG. 4, thereby increasing the contact area between the source/drain 138 and the contact plug formed in follow-up process, as well as reducing the contact resistance. However, the present invention is not limited thereto, and in another embodiment of the present invention, a single opening or a plurality of isolated contact slots may also be formed optionally. In other word, the sizes, shapes, numbers and the arranged patterns of the contact opening are all allowed to be further adjusted according to the practical process. Also, In another embodiment of the present invention, a cleaning process may be performed right after the second patterned mask layer 210 is removed, for example, using argon to clean the surface where the contact slot 230 is formed, for removing the etching residue, and also a pre-silicidation cleaning process may be further performed after the first patterned mask layer 190 is removed.

Figure 6:
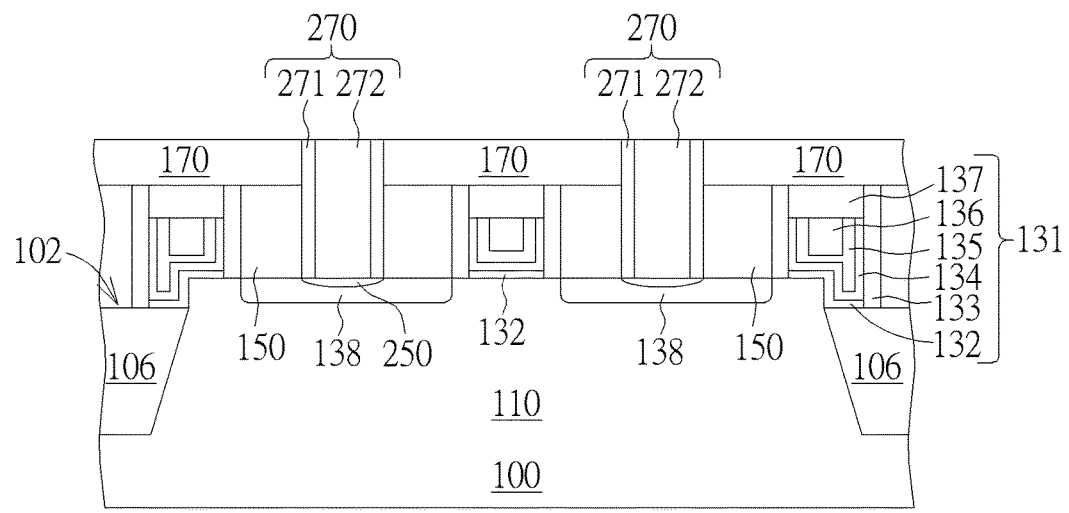
Figure 7:
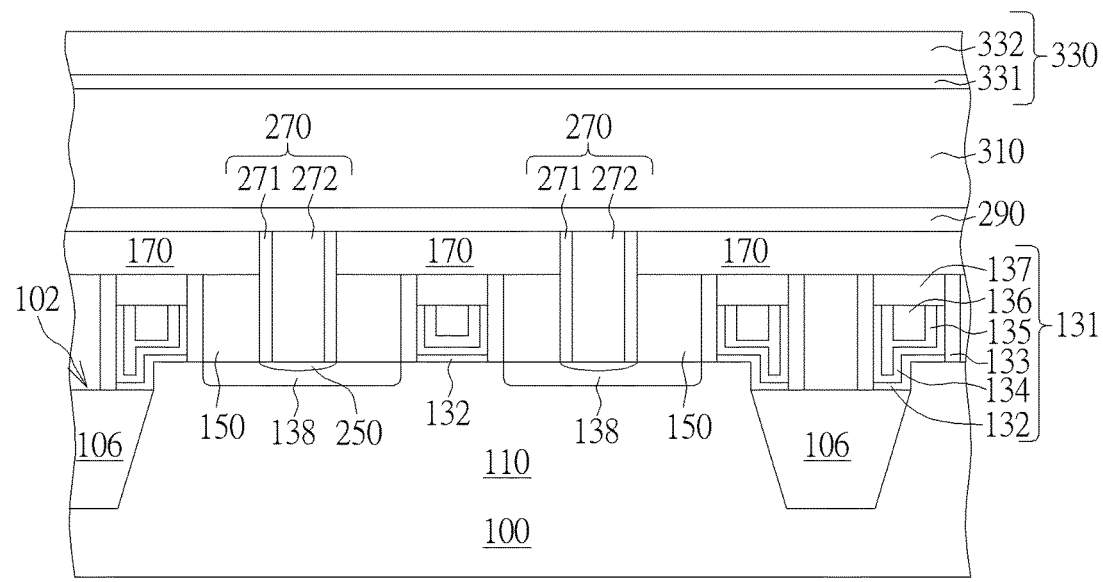

Next, as shown in FIG. 6, a silicidation process and a contact plug forming process are carried out sequentially in the contact slot 230, to form a silicide layer 250 on a surface of the source/drain 138 which is exposed by the contact slot 230, and a contact plug 270 is formed in the contact slot 230. Precisely, the silicidation process of the present embodiment may include conformally forming a metal layer (not shown in the drawings) in the contact slot 230, wherein the metal layer may include metal which is selected from a group of titanium, cobalt (Co), nickel (Ni) and platinum (Pt), and preferably titanium, but not limited thereto. Then, an annealing process, for example including a soak annealing process and a spike annealing process, is performed to have the metal layer reacted with the exposed source/drain 138 to form the silicide layer 250, such as titanium silicide (TiSi). After these, the unreacted metal layer is removed and the contact plug forming process is then carried out. It is noted that, the contact plug 270 may be filled in the contact slot 230 to electrically connect the source/drain 138 through the silicide layer 250.

The method of forming the contact plug 270 of the present embodiment, for example, may include sequentially forming a barrier material layer (not shown in the drawings) and a metal material layer (not shown in the drawings) in the contact slot 230, and removing a portion of the metal material layer and a portion of the barrier material layer through a planarization process (e.g. a CMP process, an etching process or a combination of both), to form the contact plug 270 including a barrier layer 271 and a contact metal layer 272. Thus, the contact plug 270 may include a top surface level with the dielectric layer 170, and has a surface which is higher than the metal gate structure 131 which is level with the interlayer dielectric layer 150. Furthermore, in one embodiment of the present invention, the barrier layer 271 may include a titanium layer, titanium nitride layer, tantalum layer or tantalum nitride layer; and the contact metal layer 272 may include tungsten or metal having lower resistance, but not limited thereto.

In addition, people in the arts shall easily realize that the silicidation process and the contact plug forming process of the present invention is not limited to be formed through the above-mentioned steps, but can include other methods which are well known by one skilled in the arts. For example, in another embodiment of the present invention, a first metal layer (not shown in the drawings), such as a titanium layer, and a second metal layer (not shown in the drawings), such as a titanium nitride, may be formed sequentially in the contact slot, wherein the first metal layer directly contacts the source/drain to react with the source/drain during an annealing process to form the silicide layer, and the second metal layer may optionally remain to function as a barrier layer of the contact plug.

Then, as shown in FIGS. 7-11, another contact slot forming process is carried out. Firstly, referring to FIG. 7, a dielectric layer 310, such as a silicon oxide layer, and a mask layer 330 are sequentially formed on the substrate 100 entirely. It is noted that, the mask 330 of the present embodiment has a multilayer structure, wherein the multilayer structure includes a first layer 331 and a second layer 332 stacked from bottom to top. The multilayer structure may include different materials according to various processes, and preferably, the first layer 331 and the second layer 332 may include materials having etching selectivity relative from each other. For example, in one embodiment of the present invention, the first layer 331 may include titanium layer, titanium nitride layer, tantalum layer or tantalum nitride layer; and the second layer 332 may include a mask material such as silicon oxide, silicon nitride, silicon oxynitride, or silicon carbonitride, but not limited thereto. Also, the present embodiment preferably additionally forms an etch stop layer 290, such as a titanium nitride layer, on the dielectric layer 170 disposed on the substrate 100, before the dielectric layer 310 is formed. However, the present invention is not limited thereto, and in another embodiment, the etch stop layer may also be omitted.

Figure 8:
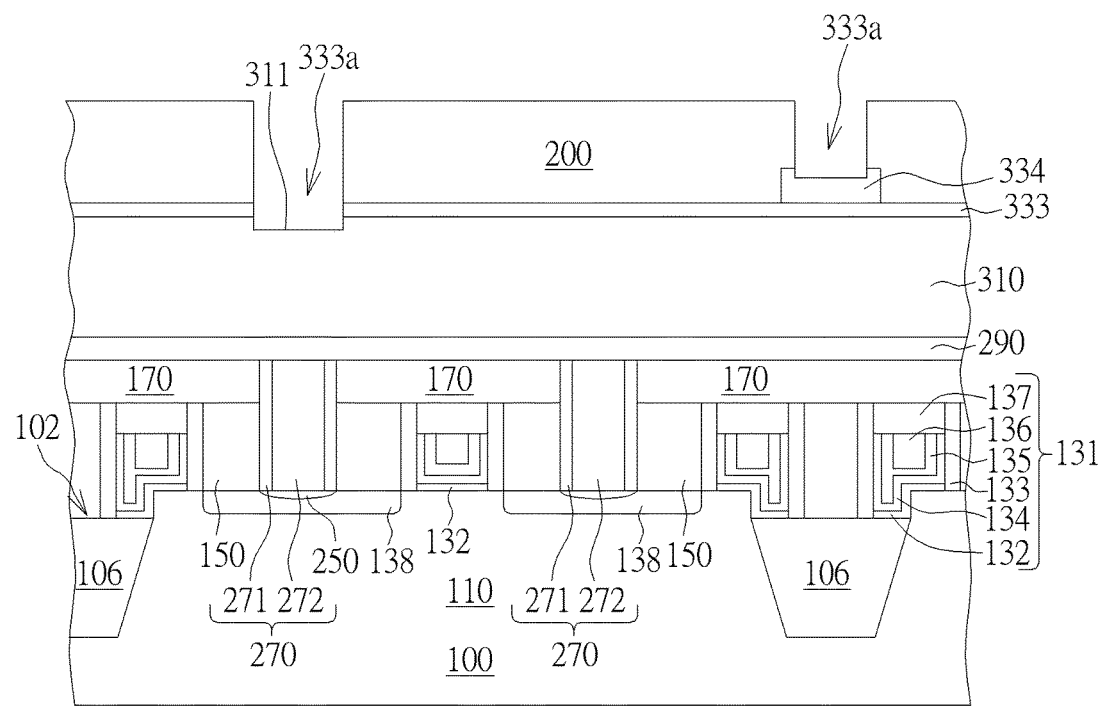
Figure 9:
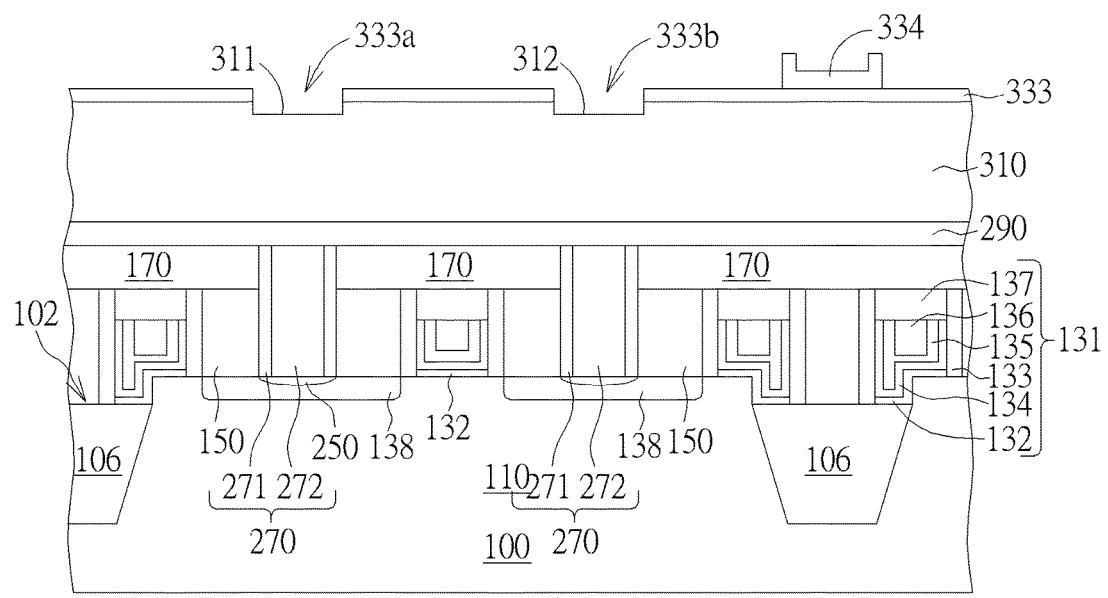
Figure 10:
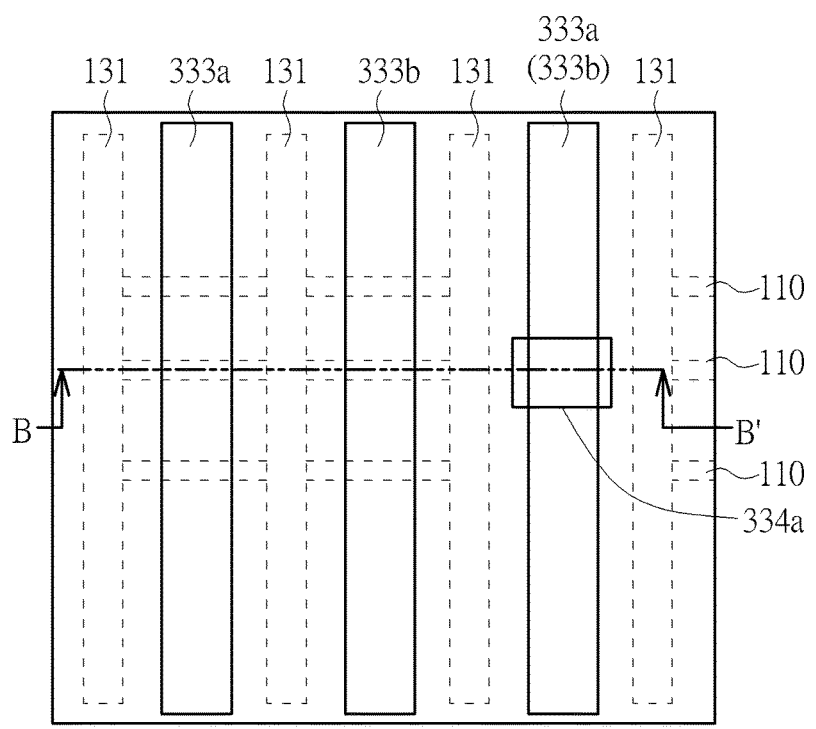

Next, as shown in FIGS. 8-10, the second layer 332 and the first layer 331 are patterned respectively, wherein FIG. 9 is a cross sectional view taken along the cross line B-B' of FIG. 10. Firstly, referring to FIG. 8, the second layer 332 of the mask layer 330 is patterned, to form a patterned second layer 334 as shown in FIG. 8. Precisely, the method of forming the patterned second layer 334 may include forming a first patterned photoresist layer (not shown in the drawings) on the second layer 332 of the mask layer 330, wherein the first patterned photoresist layer is used to define a slot-cut pattern. Next, the slot-cut pattern of the first patterned photoresist layer is then transferred to the second layer 332, such that the patterned second layer 334 is formed to include at least one slot-cut pattern 334a.

Subsequently, the first layer 331 of the mask layer 330 is patterned, to form a patterned first layer 333 for defining contact slot patterns. In the present embodiment, a double patterning lithography (DPL) process is used to define those contact slot patterns. For example, a sacrificial mask material layer, and a second patterned photoresist layer which is used to define a portion of the contact slot patterns are entirely formed on the substrate 100 at first, and the portion of the contact slot patterns of the second patterned photoresist layer is transferred to the sacrificial mask material layer, to form a patterned sacrificial mask layer 200. Then, another etching process is carried out, with the patterned second layer 334 blocking a portion of the patterns of the patterned sacrificial mask layer 200, such that, the other portion of the patterns of the patterned sacrificial mask layer 200 is transferred to the first layer 331 of the mask layer 330 and the dielectric layer 310 underneath, thereby forming a primary trench 311 and a contact slot pattern 333a in the first layer 331. After removing the patterned sacrificial mask layer 200, through the same or similar process mentioned above, another portion of the contact slot pattern is then defined by using another patterned sacrificial mask layer (not shown in the drawings). Wherein the patterned sacrificial mask layer is filled in the primary trench 311, and is also partially blocked by the patterned second layer 334, thereby forming another primary trench 312 and another contact slot pattern 333b in the first layer 331. After these, as shown in FIG. 9, the patterned sacrificial mask layer is removed.

It is worth mentioning that, the second layer 332 and the first layer 331 of the mask layer 330 include different materials, such that, while the first layer 331 is etched to form the primary trenches 311, 312 via the DPL process, the patterned second layer 334 exposed by the patterned sacrificial mask layer 200 may only be etched slightly, and is free from being penetrated through. Moreover, please note that, while defining the contact slot patterns, the first layer 331 of the mask layer 330 and a portion of the dielectric layer 310 underneath are both etched simultaneously. Accordingly, the contact slot patterns are preferably defined through a two-step etching process, thereby sequentially etching the first layer 331 and the portion of the dielectric layer 310 by using different etchants. For example, a first etchant including chloride, may be provided firstly, to etch the first layer 331 to form the patterned first layer 333, and then a second etchant including Sulfur hexafluoride ($SF_6$) or nitrogen trifluoride ($NF_3$), to further etch the dielectric layer 310 without penetrating it, thereby forming the primary trenches 311, 312 in the dielectric layer 310. However, the present invention is not limited thereto.

It is worth mentioning further, the patterned first layer 333 of the present embodiment has the contact slot patterns 333a, 333b which are preferably disposed in alignment with the position of the contact slot 230, and also in an extending stripe parallel to the extending direction of the metal gate structure 131, as shown in FIG. 10. The patterned second layer 334 includes at least one slot-cut pattern 334a, which is configured to define the slot-cut portion, thereby blocking a portion of the contact slot patterns 333a, 333b on the second patterned photoresist layer. Thus, as shown in FIG. 10, a portion of the contact slot patterns 333a, 333b may be divided into two parts.

Figure 11:
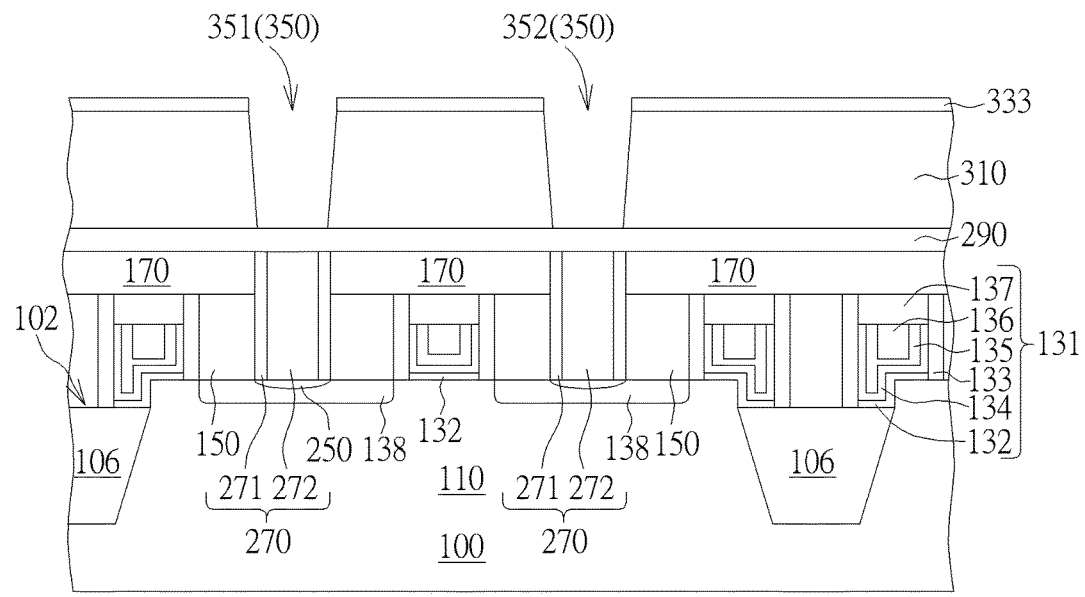

As shown in FIG. 11, after the patterned second layer 332 is removed, another etching process, such as a dry etching process, a wet etching or a sequentially performed dry and wet etching process, is then performed, to further etch the dielectric layer 310 by using the patterned first layer 333 to serve an etch mask, thereby forming at least one contact slot 350. Precisely, the contact slot 350 is formed by penetrating through the dielectric layer 310 to the etch stop layer 290, wherein the etch stop layer 290 is used to serve as a stop layer, so as to not expose the contact plug 270 underneath. However, the method of forming the contact slot of the present invention is not limited to the above-mentioned steps, and may include other processes. For example, in another embodiment, the contact slots 351, 352 may be defined through a same lithography process. Otherwise, the contact slots may also be formed through directly penetrating the etch stop layer, or the contact slots may be formed to directly contact the contact plug underneath while the etch stop layer is omitted.

Figure 12:
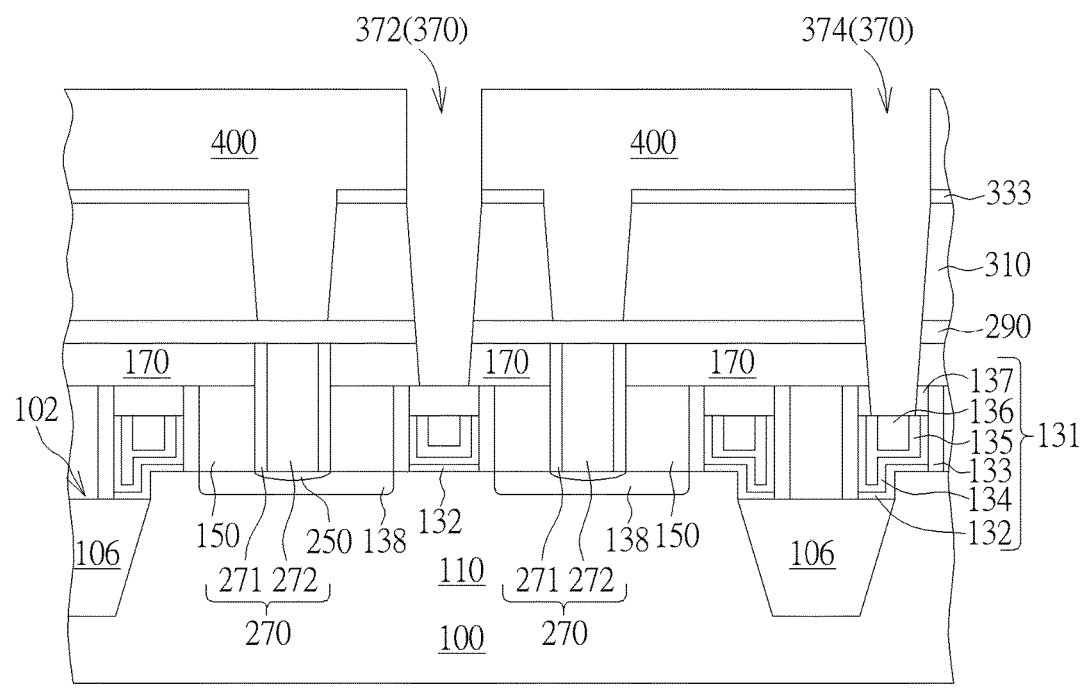
Figure 13:
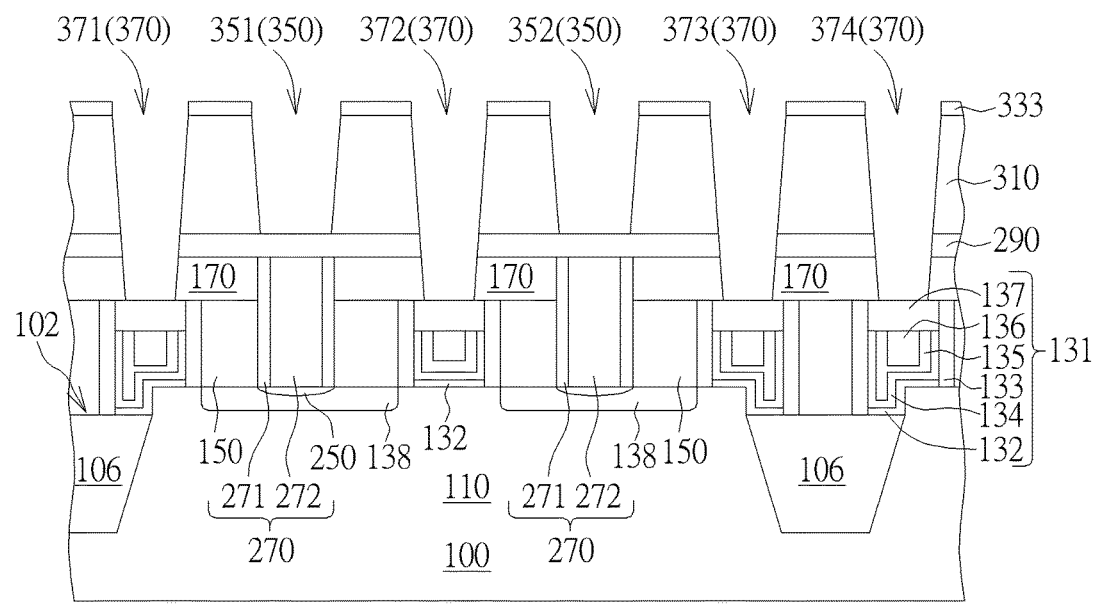

In the following, as shown in FIGS. 12-13, a (gate structure) contact slot process is performed. In the present embodiment, the gate structure contact slot pattern is defined also through the DPL process. Firstly, as shown in FIG. 12, a patterned sacrificial mask layer 400 is formed on the dielectric layer 310 disposed on the substrate 100 to fill the contact slots 351, 352, and which is configured to define a portion of the contact slot pattern. Then, the pattern of the patterned sacrificial mask layer 400 is then transferred to the patterned first layer 333 and the dielectric layer 310, to form contact slots 372, 374, wherein the contact slots 372, 374 are formed in alignment with the metal gate structure 131 in the interlayer dielectric layer 150. Precisely, the method of forming the contact slots 372, 374, for example, includes entirely forming a sacrificial mask layer (not shown in the drawings) to fill in the contact slot 350, forming a third patterned photoresist layer (not shown in the drawings) on the sacrificial mask layer, and transferring a pattern of the third patterned photoresist layer to the sacrificial mask layer, thereby forming the patterned sacrificial mask layer 400. Finally, the third patterned photoresist layer is removed, and another etching process, such as a dry etching process, a wet etching or a sequentially performed dry and wet etching process, is then carried out by using the patterned sacrificial mask layer 400 to serve as an etch mask, to form the contact slots 372, 374. Next, another portion of the contact slot pattern is also defined through the same forming process as shown in FIG. 13.

It is noted that, in the present embodiment, the contact slots 370 (including contact slots 371, 372, 373, 374) penetrate the first layer 333, the dielectric layer 310, the etch stop layer 290 and the dielectric layer 170, by using the capping layer 137 to serve as a stop layer, as shown in FIG. 13. However, the forming method of the contact slots 370 is not limited to the above-mentioned steps, and may include other processes. For example, in other embodiment, the contact slots may also be formed by using the etch stop layer 290 to serve as a stop layer. Otherwise, the contact slots 370 may all be formed through a single patterning lithography, or the contact slots 371, 372, 373, 374 may be formed through multi-patterning lithography respectively, for improving the tolerance of the etching process.

Figure 14:
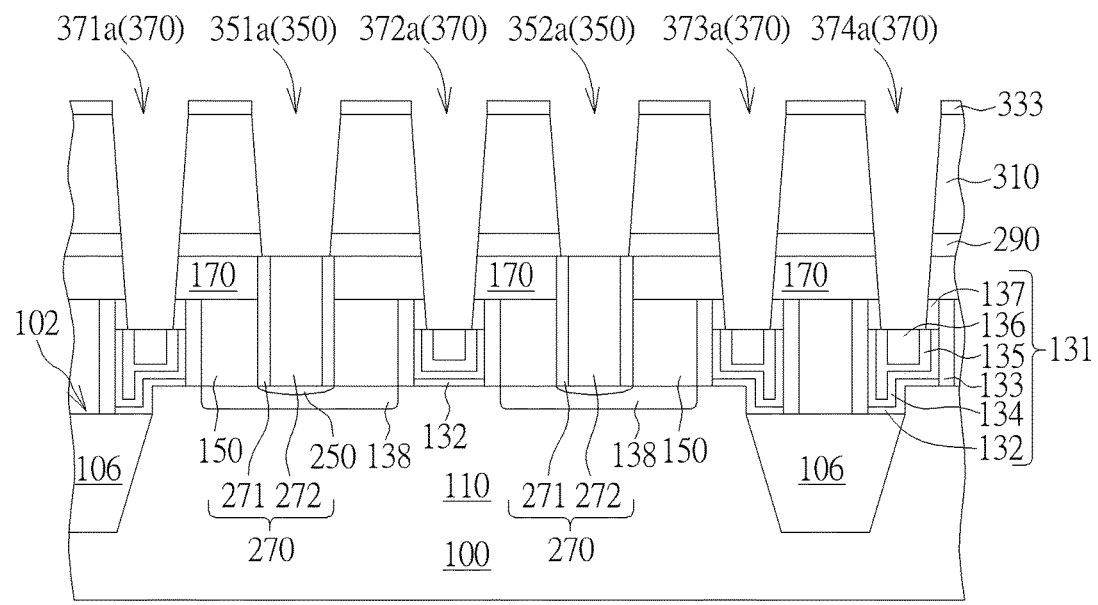
Figure 15:
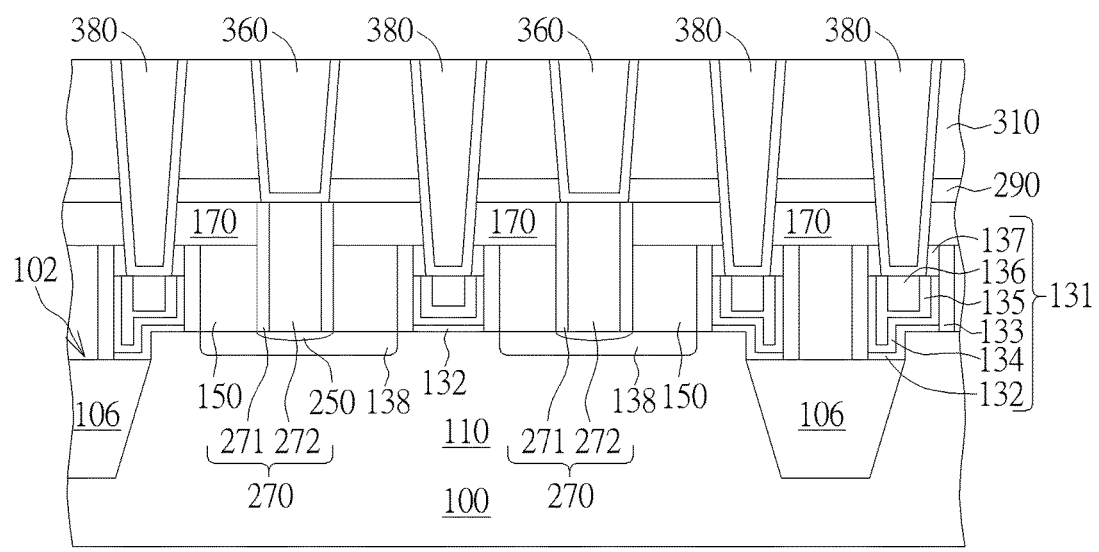

Finally, after the contact slots 350, 370 are formed, a cleaning process may be optionally performed, for example, using argon to clean the surface of the contact slots 350, 370. Subsequently, as shown in FIG. 14, another removing process is performed, to simultaneously remove the etch stop layer 290 exposed from the contact slots 350 and the capping layer 137 exposed from the contact slots 370, thereby forming the contact slots 350a, 370a. In this way, the top surface of the contact plug 270, as well as the metal layer 136 of the metal gate structure 131, may be partially exposed from the contact slots 350a, 370a respectively. In the following, contact plug 360, 380 may be formed respectively in the contact slots 350a, 370a, to electrically connect the contact plug 270 and the transistor 130, as shown in FIG. 15.

Through the above-mentioned steps, the semiconductor device of a preferred embodiment of the present invention is obtained. In view of FIG. 15 further, the method of forming the semiconductor device of the preset invention includes firstly forming a first contact plug (namely, the contact plug 270) in a first dielectric layer (namely, including interlayer dielectric layer 150 and the dielectric layer 170) disposed on the substrate, to electrically connect the source/drain 138, forming a second dielectric layer (namely, the dielectric layer 310) on the first dielectric layer, then, forming a first contact slot (namely, the contact slot 350a) in the second dielectric layer and a second contact slot (namely, the contact slot 370a) in the second dielectric layer and the first dielectric layer, and further forming a second contact plug (namely, the contact plug 360) which is electrically connected to the first contact plug and a third contact plug (namely, the contact plug 380) which is electrically connected to the metal gate structure. Wherein, the method of forming the first contact plug may include forming a third contact slot (namely, the contact slot 230) in the first dielectric layer, to expose the source/drain, and forming the first contact plug in the third contact slot.

In summary, the method of forming the semiconductor device mainly utilizes a multilayer mask layer, with a first layer and a second layer of the mask layer having at least one slot-cut pattern and a plurality of contact slot patterns respectively, thereby separating the extending stripe of the contact slot into two parts in the following etching process of the contact slot. In this way, these two parts of the contact slot may be electrically connected to different circuits, thereby providing signal input/output pathways for the transistor. Furthermore, in the present method, a first lithography process is carried out to form a contact slot over a contact plug, to expose an etch stop layer formed on the contact plug, a second lithography process is then carried out to form another contact slot over a metal gate, to expose a capping layer formed on the metal gate, and a removing process is carried out to simultaneously remove the exposed etch stop layer and the capping layer, to expose the contact plug and the metal gate. Thus, the method of forming the semiconductor device of the present invention may effectively improve the current issues and limitation in lithography techniques, thereby providing a preferred integrated process while forming the metal gate and contact plug.

In addition, although the aforementioned embodiments are exemplified as a "gate-last" process and a "high-k first" process, people in the art shall easily realize that, in another embodiment, the method of the present invention may also be formed on a "gate-first" process or a "high-k last" process. For example, the present invention may include removing the high-k gate dielectric layer before the work function metal layer is formed, and then forming another high-k gate dielectric layer, the work function metal layer and the metal gate sequentially in the gate trench. Furthermore, although the aforementioned embodiments are mainly applied on a method of forming a non-planar transistor, the present invention may also be used on a method of forming other planar transistors. For example, the fin-shaped structure may be omitted, and the gate structure and other elements may be formed directly on the planar substrate which is well known by one skilled in the arts.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of forming a semiconductor device, comprising:
   providing a substrate having a transistor, wherein the transistor comprises a gate structure and a source/drain;
   forming a first dielectric layer covering the substrate;
   forming a first contact plug in the first dielectric layer, wherein the first contact plug is electrically connected to the source/drain;
   forming a second dielectric layer on the first dielectric layer;
   forming a mask layer on the second dielectric layer, wherein the mask layer comprises a multilayer structure having a first layer and a second layer stacked on the first layer;
   patterning the second layer to form a slot-cut pattern;
   forming a sacrificial mask layer on the slot-cut pattern;
   forming two contact slot patterns in the first layer and the sacrificial mask layer, wherein one of the contact slot patterns penetrates the sacrificial mask layer and the first layer, and another one of the contact slot patterns penetrates the sacrificial mask layer and partially penetrates the slot cut pattern;
   removing the sacrificial layer and the second layer; and
   forming a first contact slot in the second dielectric layer through the contact slot pattern in the first layer.

2. The method of forming a semiconductor device according to claim 1, further comprising:
   forming the first contact slot to expose a top surface of the first contact plug; and
   forming a second contact plug in the first contact slot, wherein the second contact plug is electrically connected to the first contact plug.

3. The method of forming a semiconductor device according to claim 1, wherein, the second layer comprises oxide, silicon nitride, or silicon carbonitride, and the first layer comprises titanium, titanium nitride, tantalum or tantalum nitride.

4. The method of forming a semiconductor device according to claim 1, further comprising:
   forming a patterned sacrificial mask layer on the second dielectric layer; and
   forming a second contact slot in the second dielectric layer and the first dielectric layer through the patterned sacrificial mask layer.

5. The method of forming a semiconductor device according to claim 4, further comprising:
   forming a third contact plug in the second contact slot, wherein the third contact plug is electrically connected to the gate structure.

6. The method of forming a semiconductor device according to claim 1, further comprising:
   forming an etch stop layer between the first dielectric layer and the second dielectric layer, wherein the forming of the first contact slot comprises using the etch stop layer as a stop layer to form a contact slot.

7. The method of forming a semiconductor device according to claim 6, further comprising:
   forming a patterned sacrificial mask layer on the second dielectric layer, wherein the patterned sacrificial mask layer is filled in the contact slot; and
   forming a second contact slot in the second dielectric layer and the first dielectric layer through the patterned sacrificial mask layer.

8. The method of forming a semiconductor device according to claim 7, wherein, the gate structure comprises a capping layer, and the forming of the second contact slot comprises forming the second contact slot by using the capping layer as a stop layer, to form a contact slot.

9. The method of forming a semiconductor device according to claim 8, further comprising:
   performing a removing process to simultaneously remove a portion of the etch stop layer and a portion of the capping layer to form the first contact slot and the second contact slot; and
   forming a second contact plug in the first contact slot, and simultaneously forming a third contact plug in the second contact slot, wherein the second contact plug is electrically connected to the first contact plug and the third contact plug is electrically connected to the gate structure.

10. The method of forming a semiconductor device according to claim 1, wherein a top surface of the first contact plug is formed to be higher than a top surface of the gate structure.

11. The method of forming a semiconductor device according to claim 1, further comprising:
    forming the first dielectric layer in a bilayer structure, wherein the first dielectric layer comprises an interlayer dielectric layer level with a top surface of the gate structure and a dielectric layer level with a top surface of the first contact plug.

12. The method of forming a semiconductor device according to claim 11, wherein the forming of the first contact plug comprises:
   forming a third contact slot in the dielectric layer and the interlayer dielectric layer to expose the source/drain;
   filling a first metal material layer in the third contact slot; and
   performing a planarization process.

13. The method of forming a semiconductor device according to claim 12, further comprising:
   forming a first patterned mask layer on the first dielectric layer;
   forming a second patterned mask layer on the first dielectric layer, wherein a pattern on the first patterned mask layer crosses a pattern on the second patterned mask layer; and
   forming the third contact slot through the patterns of the first patterned mask layer and the second patterned mask layer.

14. The method of forming a semiconductor device according to claim 13, wherein the second patterned mask layer comprises a tri-layer structure.

15. The method of forming a semiconductor device according to claim 12, comprising:
   performing a self-aligned silicidation process to form a silicide layer on the source/drain exposed by the third contact slot.

16. The method of forming a semiconductor device according to claim 1, further comprising:
   providing a fin structure in the substrate, wherein the source/drain is formed in the fin structure.

* * * * *